(12) United States Patent
Lee

(10) Patent No.: US 6,801,059 B2
(45) Date of Patent: *Oct. 5, 2004

(54) COMPARATOR WITH OFFSET VOLTAGE

(75) Inventor: Jung-Bong Lee, Seoul (KR)

(73) Assignee: Hyundai Electronics Industries Co., Ltd., Kyoungki-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 10/201,788

(22) Filed: Jul. 25, 2002

(65) Prior Publication Data

US 2002/0180492 A1 Dec. 5, 2002

Related U.S. Application Data

(62) Division of application No. 09/783,963, filed on Feb. 16, 2001, now Pat. No. 6,445,218.

(30) Foreign Application Priority Data

Jul. 20, 2000 (KR) ........................................ 2000-41749

(51) Int. Cl.[7] ................................................ H03K 5/22
(52) U.S. Cl. ............................ 327/65; 327/66; 327/307
(58) Field of Search ...................... 327/307, 70, 50–53, 327/63, 65, 66, 560–563, 477, 538, 541, 543; 330/9, 253, 258, 261, 311

(56) References Cited

U.S. PATENT DOCUMENTS

| | | | | |
|---|---|---|---|---|
| 4,754,169 A | | 6/1988 | Morris ........................ | 327/307 |
| 4,794,349 A | * | 12/1988 | Senderowicz et al. ...... | 330/253 |
| 5,512,848 A | | 4/1996 | Yaklin ......................... | 327/65 |
| 5,729,178 A | * | 3/1998 | Park et al. ................... | 330/258 |
| 5,912,583 A | * | 6/1999 | Pierson et al. .............. | 327/553 |
| 6,005,440 A | * | 12/1999 | Okamoto ..................... | 330/253 |
| 6,034,568 A | * | 3/2000 | Bonaccio et al. ........... | 330/253 |
| 6,172,535 B1 | * | 1/2001 | Hopkins ....................... | 327/66 |
| 6,215,339 B1 | * | 4/2001 | Hedberg ...................... | 327/108 |
| 6,445,218 B1 | * | 9/2002 | Lee ............................. | 327/65 |

* cited by examiner

Primary Examiner—Long Nguyen
(74) Attorney, Agent, or Firm—Fleshner & Kim, LLP (57) ABSTRACT

A comparator according to the present invention can generate an output signal of low or high level by comparing a first and second input voltages that have a common voltage. An input stage circuit of a comparator according to the present invention receives a common voltage detection signal. The common voltage is supplied with a first offset voltage when the common voltage detection signal is on low level, and the common voltage is supplied with a second offset voltage when the common voltage detection signal is on high level. Then, the input stage circuit performs amplification to output a voltage difference between the first input voltage and the second input voltage to the comparator. Accordingly, the comparator with offset voltage according to the present invention can sufficiently amplify the input signal difference of low common voltage by selectively applying different offset voltages to a common voltage in accordance with the common voltage level of the input signal. The present invention can be applied to a comparator with offset voltage and an analogue comparator having a differential input stage.

14 Claims, 9 Drawing Sheets

COMPARATOR WITH OFFSET VOLTAGE

This application is a division of Ser. No. 09/783,963 filed on Feb. 16, 2001, now U.S. Pat. No. 6,445,218.

BACKGROUND OF THE INVENTION

1. Field of the Invention

The present invention relates to a comparator with offset voltage, more particularly, to an analogue comparator having a differential input stage.

2. Background of the Related Art

An input stage of a comparator is generally constituted with a differential circuit that amplifies the voltage difference of two input signals. The two input signals are cancelled by each other when they have opposite phases and equal magnitudes, which results in no output signal.

Figure 1:
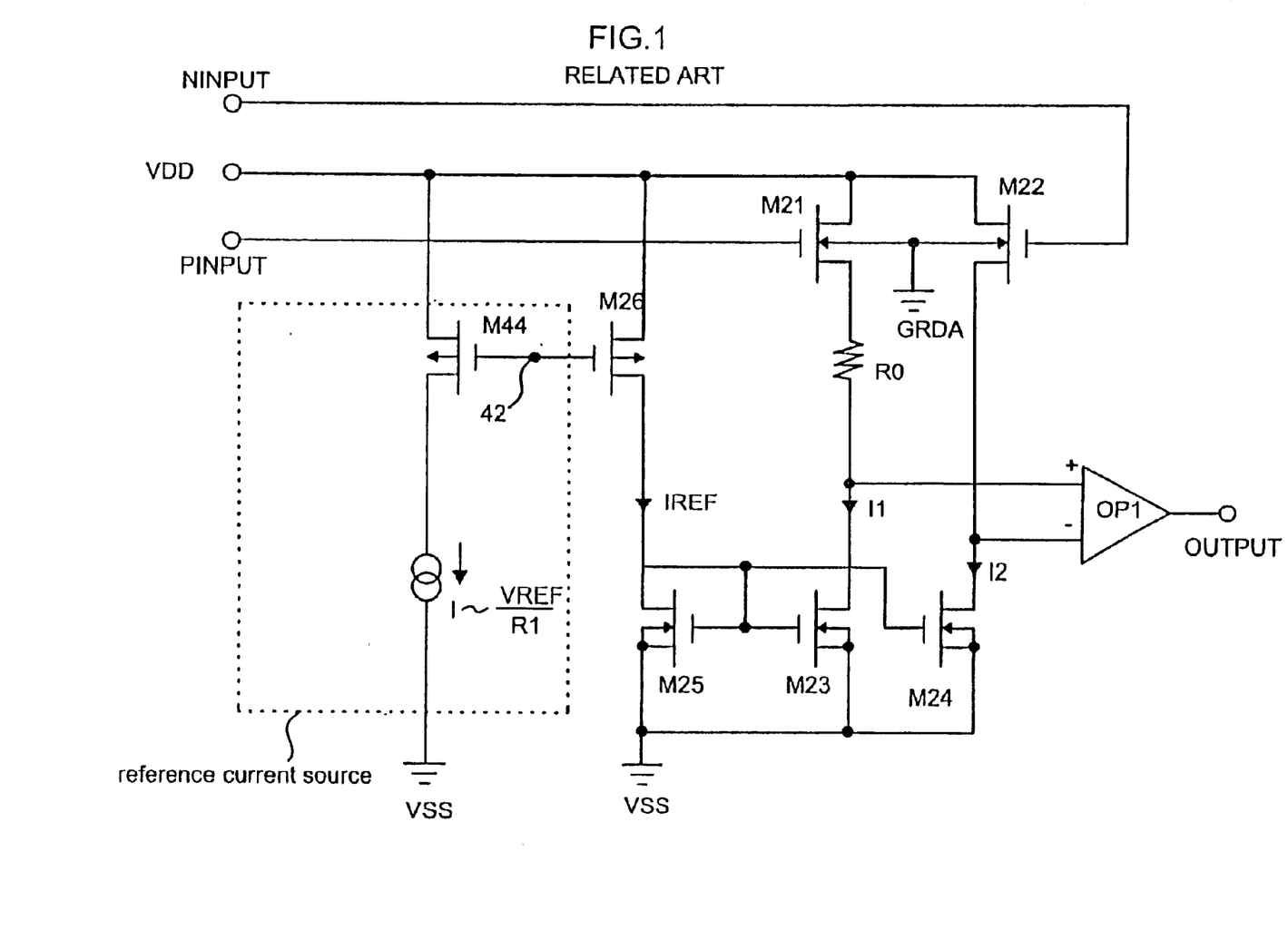
FIG. 1 is a diagram that shows a differential circuit according to a related art.

FIG. 1 is a diagram that shows a differential circuit enabling to control an offset voltage. FIG. 1 is a diagram from U.S. Pat. No. 4,754,169.

Figure 2:
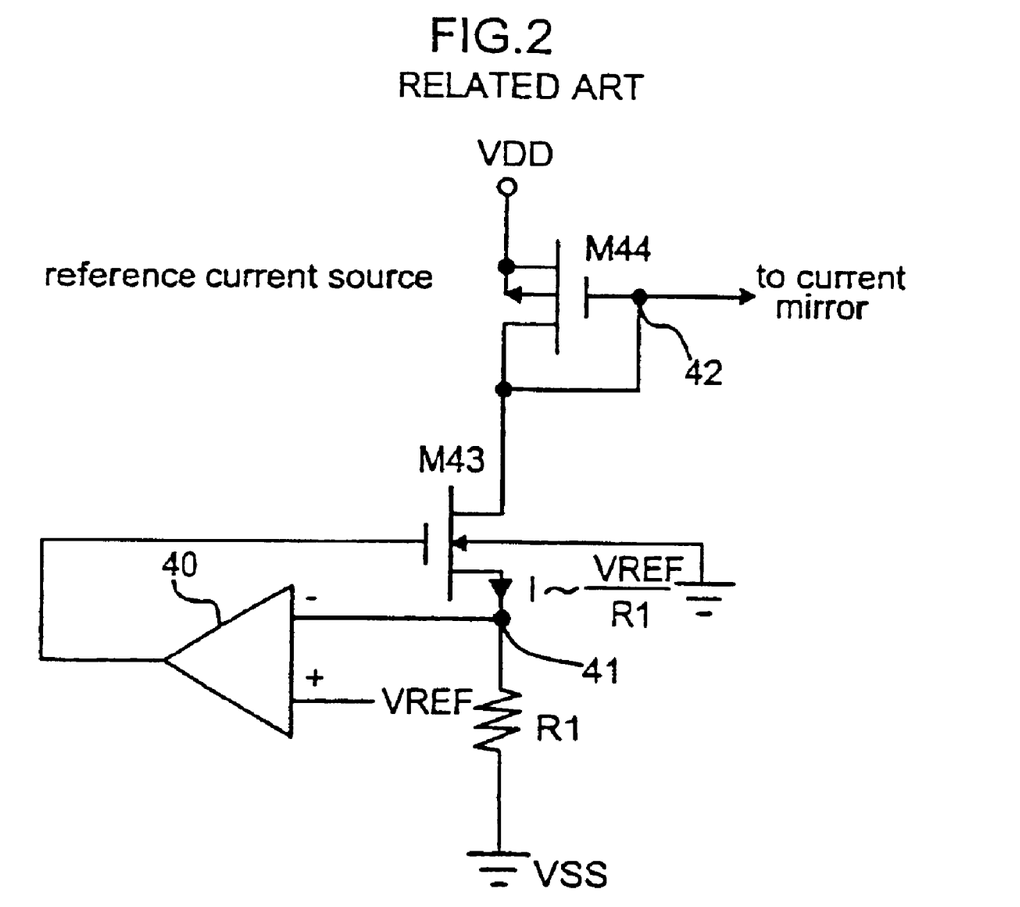
FIG. 2 is a diagram that shows a reference current generating circuit of a differential circuit according to a related art.

Referring to FIG. 1, a current I of a reference current source is $I=V_{REF}/R_1$. Additional details of the reference current source are shown in FIG. 2. The current I further becomes $I=I_{REF}=I_1=V_{REF}/R_1$ by a current mirror, and an offset voltage $V_{OFF}$ results in accordance with current $I_1$ between both ends of resistor $R_0$ as set forth by equation (1) as follows:

$$V_{OFF} = I_1 \cdot R_0 \qquad (1)$$
$$= (V_{REF}/R_1) \cdot R_0$$
$$= V_{REF} \cdot (R0/R1)$$

If the reference voltage $V_{REF}$ is constant, a predetermined offset voltage is generated by adjusting a ratio of two resistors $R_0$ and $R_1$. In this case, the resistors $R_0$ and $R_1$ should be fabricated by the same process.

As described above, the related art differential circuit has various disadvantages. The differential circuit according to a related art, which is constituted with NMOS transistors, is unable to work normally when a common voltage lower than about 1V is applied thereto.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a comparator with an offset voltage that substantially obviates one or more of the problems caused by limitations and disadvantages of the related art.

Another object of the present invention is to provide an input stage of a comparator that can sufficiently amplify an input signal difference of low common voltage.

Another object of the present invention is to provide an input stage of a comparator that enables amplification of an input signal difference of low common voltage sufficiently by applying offset voltage to the common voltage in accordance with the level of the common voltage.

To achieve at least the above objects and other advantages in a whole or in part, and in accordance with the purpose of the present invention, as embodied and broadly described, a comparator according to the present invention generates an output signal of low or high level by comparing a first input voltage to a second input voltage which have a common voltage.

To further achieve the above objects in a whole or in part, and in accordance with the purpose of the present invention, as embodied and broadly described, an input stage circuit of a comparator according to the present invention includes wherein the comparator generates a comparison result signal for a first input voltage and a second input voltage that each have a common voltage, wherein the input stage circuit receives a common voltage detection signal, wherein the common voltage is supplied with a first offset voltage when the common voltage detection signal is a first level, wherein the common voltage is supplied with a second offset voltage when the common voltage detection signal is a second level, and wherein the input stage circuit amplifies to output a voltage difference between the first input voltage and the second input voltage to the comparator.

To further achieve the above objects in a whole or in part, and in accordance with the purpose of the present invention, as embodied and broadly described, a comparator that generates an output signal by comparing a first input voltage to a second input voltage according to the present invention that includes a bias voltage generator that produces a first bias voltage and a second bias voltage, a common voltage detector that generates a common voltage detection signal responsive to a level of a common voltage of the first and second input voltages, and an input stage circuit amplifies a voltage difference between the first input voltage and the second input voltage, wherein the common voltage is supplied with a first offset voltage when the common voltage detection signal is a first level, and wherein the common voltage is supplied with a second offset voltage when the common voltage detection signal is a second level.

To further achieve the above objects in a whole or in part, and in accordance with the purpose of the present invention, as embodied and broadly described, includes an input stage circuit of a comparator, the comparator generating an output signal for a second input voltage to a first input voltage received by the input stage circuit, wherein the first and second input voltages have a common voltage, wherein the input stage circuit receives a common voltage detection signal, wherein the common voltage is supplied with a first offset voltage when the common voltage detection signal is a first level, and wherein the common voltage is supplied with a second offset voltage when the common voltage detection signal is a second level, and wherein the input stage circuit amplifies to output a voltage difference between the first input voltage and the second input voltage to the comparator.

To further achieve the above objects in a whole or in part, and in accordance with the purpose of the present invention, as embodied and broadly described, includes a method for operating a comparator that includes receiving the first and second input voltages each having a common voltage, receiving a common voltage detection signal, supplying the common voltage with a first offset value to reduce a common voltage level for the first input voltage when the common voltage detection signal is a first level, supplying the common voltage with a second offset value to increase a common voltage level of the second input voltage when the common voltage detection signal is a second level, amplifying a difference between the first and second input voltages to output a voltage difference to the comparator, and comparing the voltage difference in the comparator to output a comparison result of the first and second input voltages.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 3:
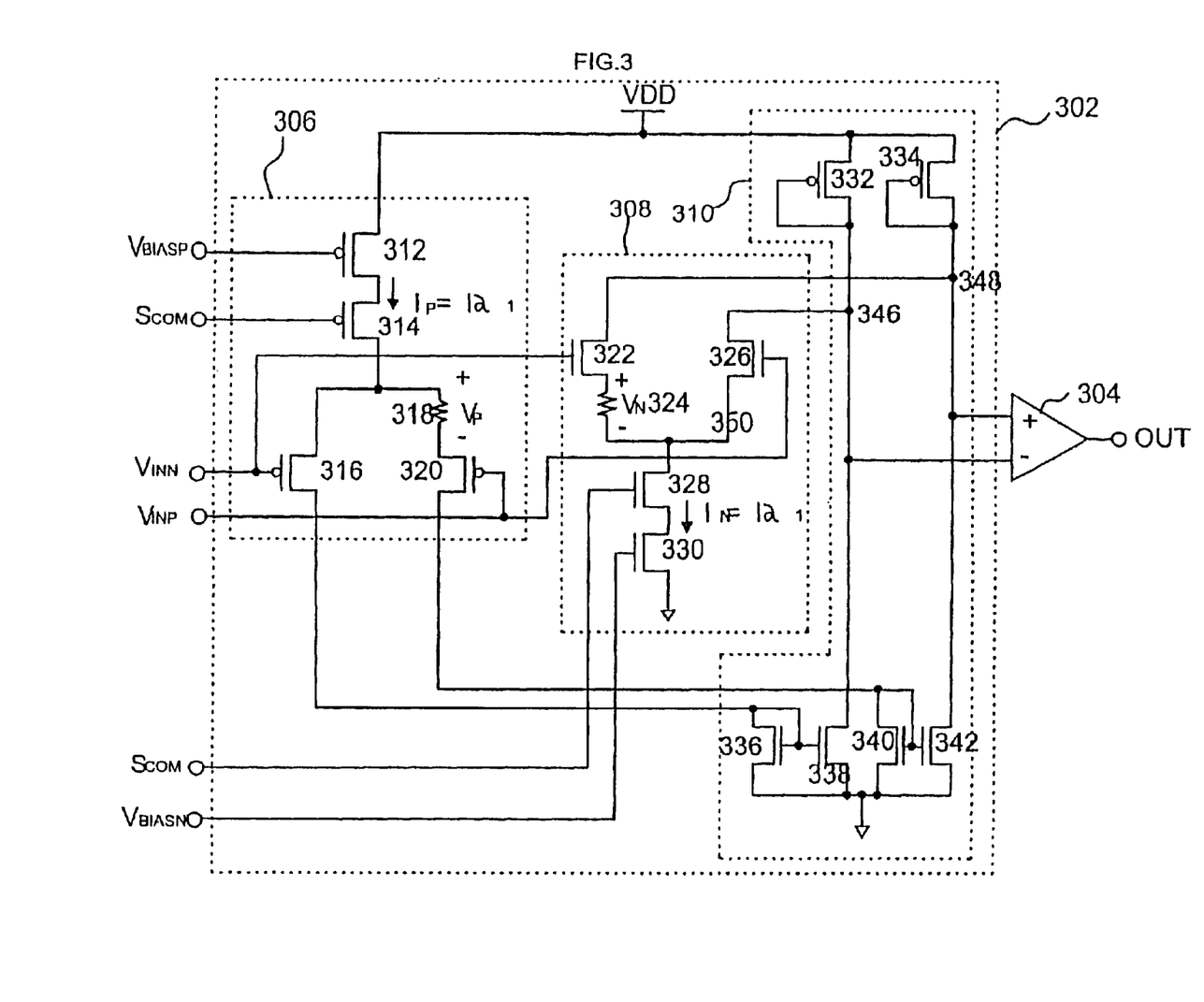
FIG. 3 is a diagram that shows a circuit of a comparator with an offset voltage according to a preferred embodiment of the present invention.

FIG. 3 is a diagram that shows a circuit of a preferred embodiment of a comparator with offset voltage according to the present invention. As shown in FIG. 3, an input stage circuit 302 of a comparator 304 according to the preferred embodiment of the comparator includes a P channel driving circuit 306, an N channel driving circuit 308, and a current output part 310.

The P channel driving circuit 306 includes a serial circuit controlled by P channel bias voltage $V_{BIASP}$ and a common voltage detection voltage $S_{COM}$, and a parallel circuit controlled by an N channel input voltage $V_{INN}$ and P channel input voltage $V_{INP}$. In the serial circuit, a couple of PMOS transistors 312 and 314 are coupled in series between power source voltage VDD and the parallel circuit. Gates of the PMOS transistors 312 and 314 are controlled by the P channel bias voltage $V_{BIASP}$ and the common voltage detection signal $S_{COM}$, respectively. In FIG. 3, a PMOS transistor 316 is connected between the PMOS transistor 314 and a NMOS transistor 336. And, a resistor 318 and a PMOS transistor 320 are connected in series between the PMOS transistor 314 and a transistor 340. Gates of the PMOS transistors 316 and 320 are preferably controlled by the N channel input signal $V_{INN}$ and P channel input signal $V_{INP}$, respectively.

The N channel driving circuit 308 includes a serial circuit controlled by N channel bias voltage $V_{BIASN}$ and a common voltage detection voltage $S_{COM}$, and a parallel circuit controlled by an N channel input voltage $V_{INN}$ and P channel input voltage $V_{INP}$. In the serial circuit, a couple of NMOS transistors 328 and 330 are coupled in series between ground voltage and the parallel circuit. Gates of the NMOS transistors 330 and 328 are controlled by the N channel bias voltage $V_{BIASN}$ and the common voltage detection signal $S_{COM}$, respectively. An NMOS transistor 322 and a resistor 324 are connected in series between a node 348 and the node 350. And, a NMOS transistor 326 is connected between the node 348 and the node 350. Gates of the NMOS transistors 322 and 326 are controlled by the N channel input signal $V_{INN}$ and the P channel input signal $V_{INP}$, respectively.

In the current output part 310, preferably a pair of PMOS transistors 332 and 334 of a diode connection type organize an active load, while four NMOS transistors 336, 338, 340, and 342 constitute a current source.

The parallel circuit of the N channel driving circuit is coupled to nodes 346 and 348. Once the N channel driving circuit 308 is activated, the PMOS transistors 332 and 334 operate as an active load of the N channel driving circuit 308. The current source 336, 338, 340, and 342 is coupled to the parallel circuit of the P channel driving circuit 306, which works as a current source only when the P channel driving circuit 306 is activated.

A non-inversion input terminal (+) and an inversion terminal (−) of the comparator 304 are coupled to the nodes 346 and 348, respectively. The comparator 304 generates an output signal OUT of low level when a node voltage $V_{N346}$ is higher than the other node voltage $V_{N348}$, and generates the output signal OUT of high level when the node voltage $V_{N348}$ is higher than the other node voltage $V_{N346}$.

Figure 4:
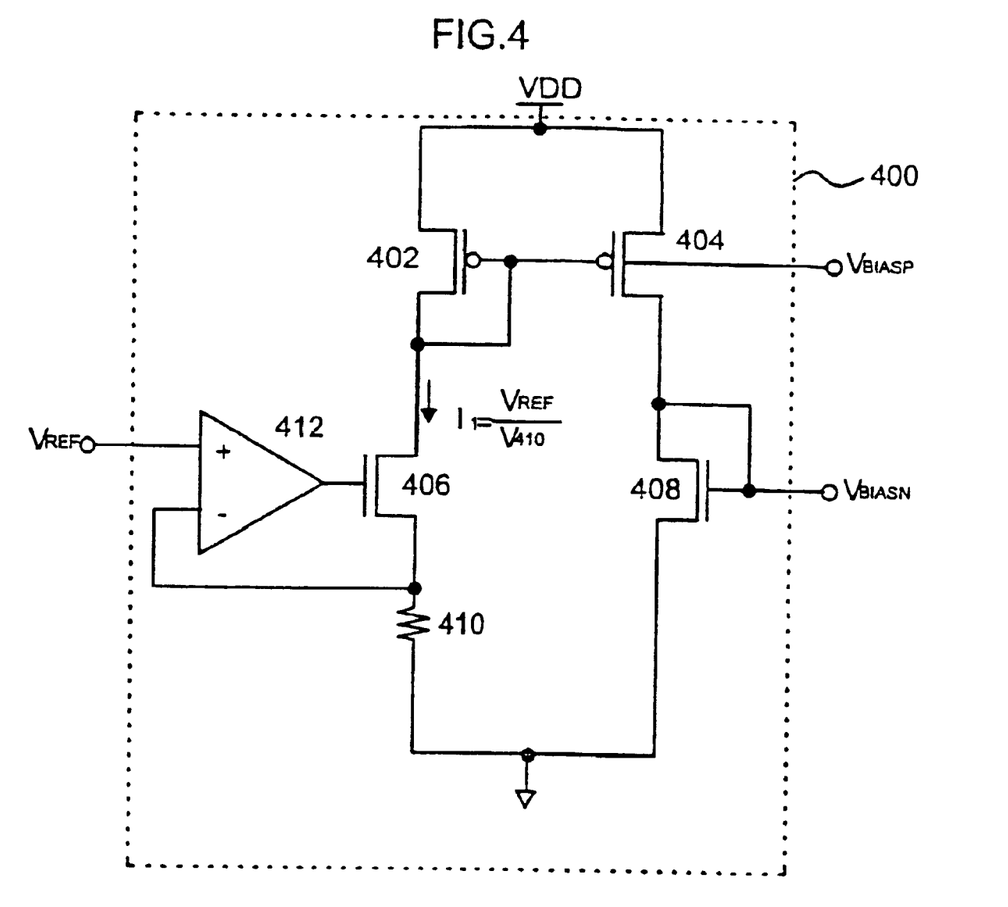
FIG. 4 is a diagram that shows a circuit of a preferred embodiment of a bias voltage generator of a comparator according to the present invention.

FIG. 4 is a diagram that shows a circuit of a preferred embodiment of a bias voltage generator of a comparator according to the present invention. As shown in FIG. 4, PMOS transistors 402 and 404 are active loads and an NMOS transistor 408 is a constant voltage source having a diode connection structure.

Reference voltage $V_{REF}$ is inputted to a non-inversion input terminal (+) of a logic amplifier 412, while an inversion input terminal (−) is coupled to a ground voltage through a resistor 410. An output of the logic amplifier 412 controls a gate voltage of an NMOS transistor 406. Thus, drain voltage of the NMOS transistor 406 maintains the same level of the reference voltage $V_{REF}$ and the current flowing through the resistor 410 is also constant as $I_1 = V_{REF}/R_{410}$. The reference current $I_1$ produces a P channel bias voltage $V_{BIASP}$ and an N channel bias voltage $V_{BIASN}$.

Figure 5:
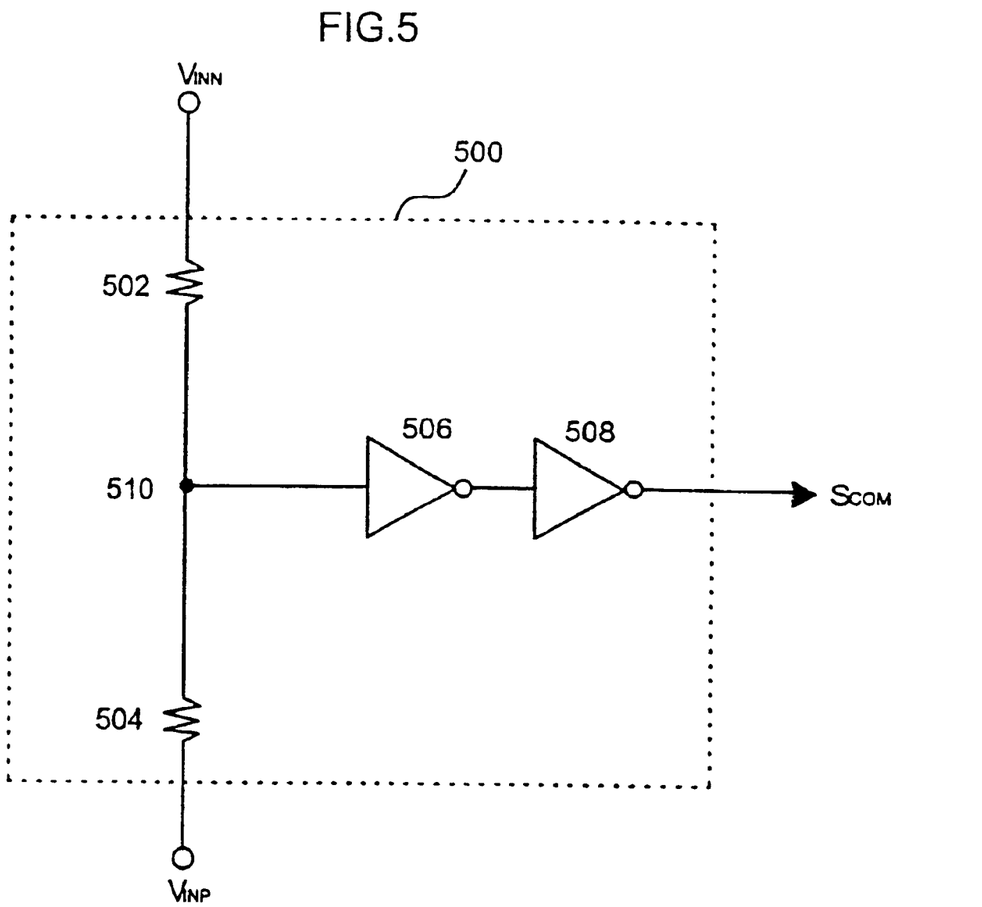
FIG. 5 is a diagram that shows a circuit of a preferred embodiment of a common voltage detector of a comparator according to the present invention.

FIG. 5 is a diagram that shows a circuit of a preferred embodiment of a common voltage detector of a comparator according to the present invention. As shown in FIG. 5, an N channel input voltage $V_{INN}$ and a P channel input voltage $V_{INP}$ are input to both ends of a pair of resistors 502 and 504 coupled in series to each other. As the N channel input voltage $V_{INN}$ and the P channel input voltage $V_{INP}$ have opposite phases, components of the respective alternating currents cancel each other to show only a direct current component at a node 510.

Two inverters 506 and 508 coupled in series from the node 510 output a common voltage detection signal $S_{COM}$ as a logic signal by changing the DC voltage of the node 510. The common voltage detection signal $S_{COM}$ is on high level when the DC level of the common voltage is equal to or higher than logic threshold voltage $V_{LT}$, and on low level when the DC level of the common voltage is lower than logic threshold voltage $V_{LT}$. In this case, the logic threshold voltage $V_{LT}$ of the inverters 506 and 508 is preferably VDD/2.

Operation of the comparator will now be described. In the input stage circuit 302, current $I_P$ flowing through the PMOS transistor 312 of the P channel driving circuit 306 and the other current $I_N$ flowing through the NMOS transistor 330 of the N channel driving circuit 308 depend on the P channel bias voltage $V_{BIASP}$ and the N channel bias voltage $V_{BIASN}$, respectively, where $I_P = I_N = \alpha I_1$ ($\alpha$ is a coefficient).

Offset voltage $V_P$ generated from the current $I_P$ between both ends of the resistor 318 of the P channel driving circuit 306 is represented by equation (2) as follows:

$$V_P = I_P \cdot R_P \quad (2)$$
$$= \alpha I_1 \cdot R_{318}$$
$$= \alpha (V_{REF} / R_{410}) \cdot R_{318}$$
$$= V_{REF} \cdot \alpha \cdot (R_{318} / R_{410})$$

Offset voltage $V_N$ generated from the current $I_N$ between both ends of the resistor 324 of the N channel driving circuit 308 is represented by equation (3) as follows:

$$V_N = I_N \cdot R_N \quad (3)$$
$$= \alpha I_1 \cdot R_{324}$$
$$= \alpha (V_{REF} / R_{410}) \cdot R_{324}$$
$$= \alpha \cdot V_{REF} \cdot (R_{324} / R_{410})$$

Once the resistors 318 and 324 have the same resistance, a prescribed offset voltage is generated because $V_N = V_P$.

Figure 6A:
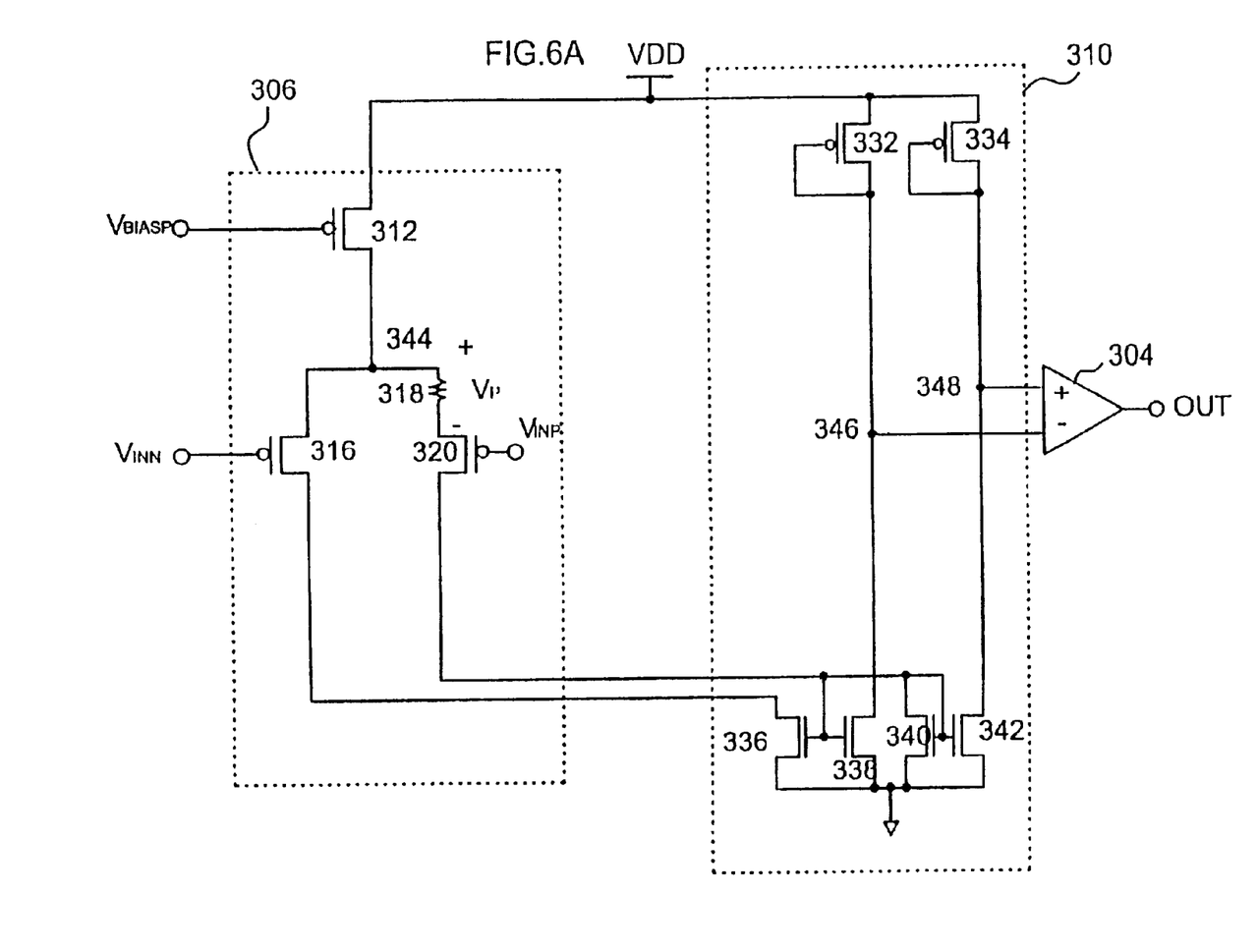
FIG. 6A is a diagram that shows a circuit for operational characteristics of the preferred embodiment of the comparator according to the present invention when a common voltage is lower than VDD/2.
Figure 6B:
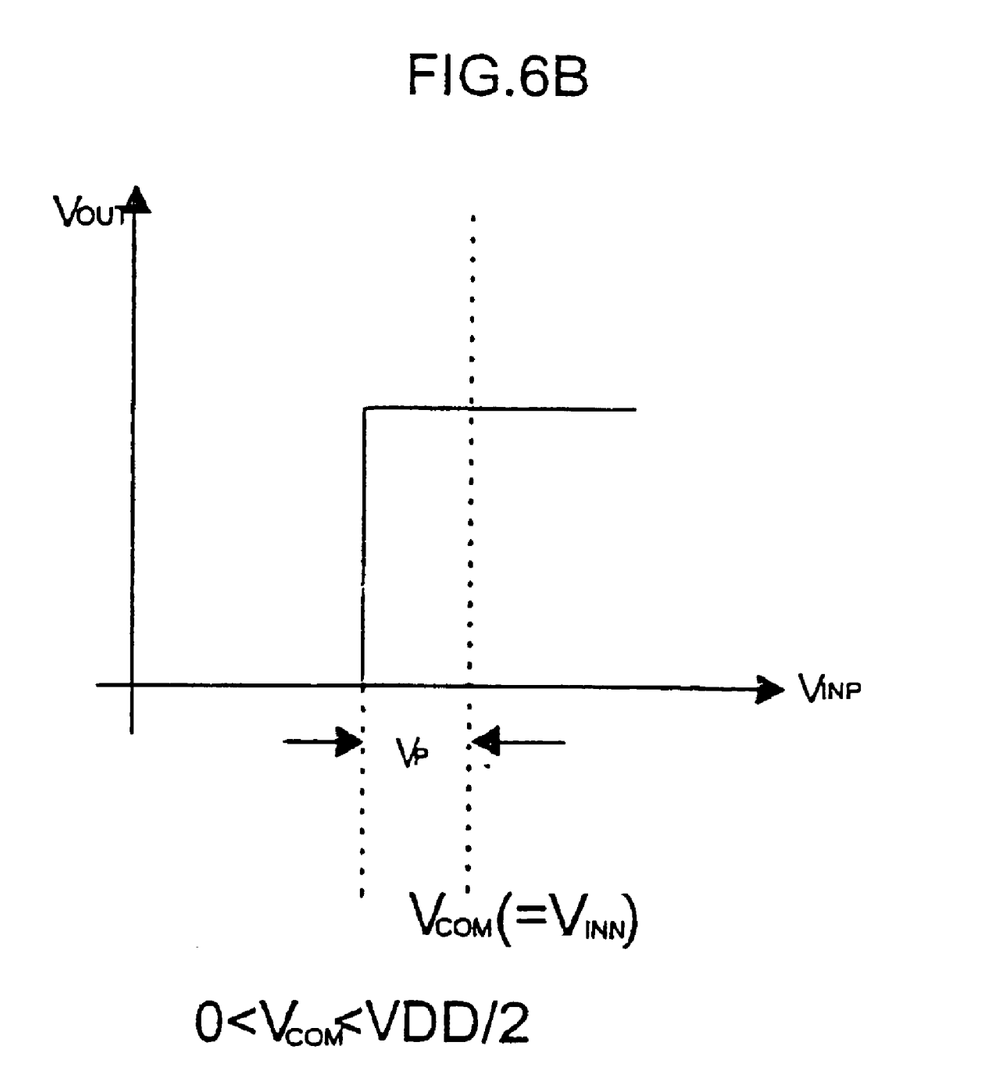
FIG. 6B is a diagram that shows a graph of voltage characteristics of the preferred embodiment of the comparator according to the present invention when a common voltage is lower than VDD/2.

FIG. 6A is a diagram that shows a circuit for operational characteristics of the preferred embodiment of the comparator according to the present invention when a common voltage is lower than VDD/2. FIG. 6B is a diagram that shows a graph of voltage characteristics of the preferred embodiment of the comparator according to the present invention when a common voltage is lower than VDD/2.

As shown in FIG. 6A and FIG. 6B, operations of the preferred embodiment of the input stage circuit when a level of common voltage $V_{COM}$ ranges 0 V to VDD/2 will now be described. The common voltage detection signal $S_{COM}$ outputted from the common voltage detector 500 becomes low level since $V_{COM} < V_{LT}$. Thus, the PMOS transistor 314 of the P channel driving circuit 306 becomes turned on, while the NMOS transistor 328 of the N channel driving circuit 308 becomes turned off.

The input stage circuit 302 of the comparator 304 according to the preferred embodiment is equalized with the circuit shown in FIG. 6A since the P channel driving circuit 306 has an influence on the current output part 310, but the N channel driving circuit 308 has no influence thereon. In this case, the input stage circuit in FIG. 6A may be regarded as the P channel driving circuit 306 combined with the current output part 310.

As shown in FIG. 6A, the voltage $V_{SG316}$ between the node 344 and the gate of the PMOS transistor 316 and the other voltage $V_{SG320}$ between the node 344 and the gate of the PMOS transistor 320 are represented by equation (4) as follows:

$$V_{SG316} = V_{N344} - V_{INN} \quad (4)$$
$$V_{SG320} = V_{N344} - V_P - V_{INP}$$

When $V_{SG316} < V_{SG320}$, that is, $V_{INN} > (V_{INP} + V_P)$, the current flowing through the drain of the PMOS transistor 316 is larger than that flowing through the drain of the PMOS transistor 320. Therefore, the current flowing through the NMOS transistors 336 and 338 from the current source of the current output part 310 to the ground is larger than that flowing through the NMOS transistors 340 and 342. As a result, an output signal OUT of the comparator 304 becomes high level since the node voltage $V_{N348}$ is relatively higher than the other node voltage $V_{N346}$.

On the other hand, when $V_{SG316} > V_{SG320}$, that is, $V_{INN} < (V_{INP} + V_P)$, the current flowing through the drain of the PMOS transistor 320 is larger than that flowing through the drain of the PMOS transistor 316. Therefore, the current flowing through the NMOS transistors 340 and 342 from the current source of the current output part 310 to the ground is larger than that flowing through the NMOS transistors 336 and 338. As a result, the output signal OUT of the comparator 304 becomes low level since the node voltage $V_{N346}$ is higher than the other node voltage $V_{N348}$. Such voltage characteristics are shown in FIG. 6B. As shown in FIG. 6B, when $V_{INN} < (V_{INP} + V_P)$, the output signal OUT becomes high level.

Figure 7A:
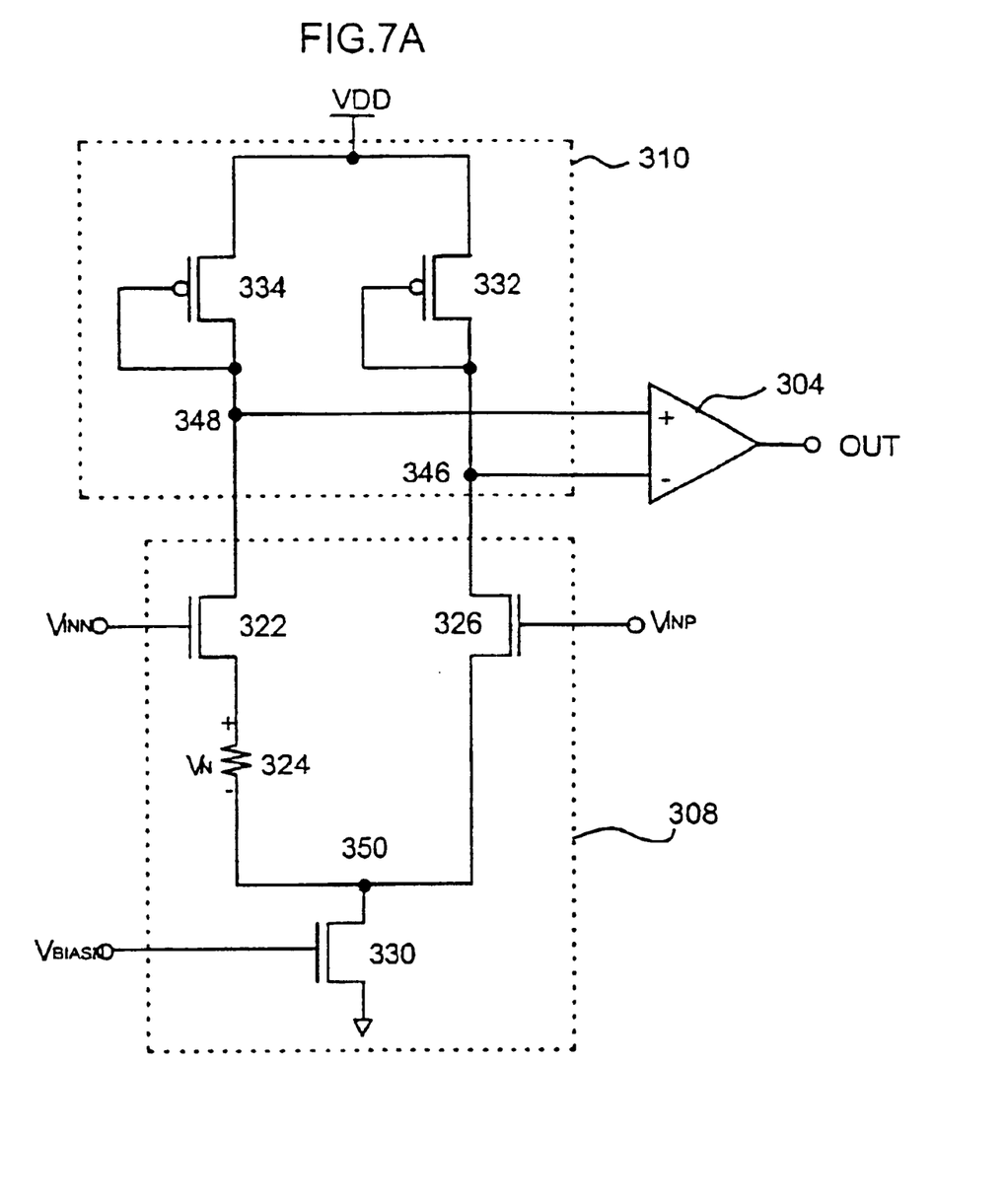
FIG. 7A is a diagram that shows a circuit for operational characteristics of the preferred embodiment of the comparator according to the present invention when a common voltage is higher than VDD/2.
Figure 7B:
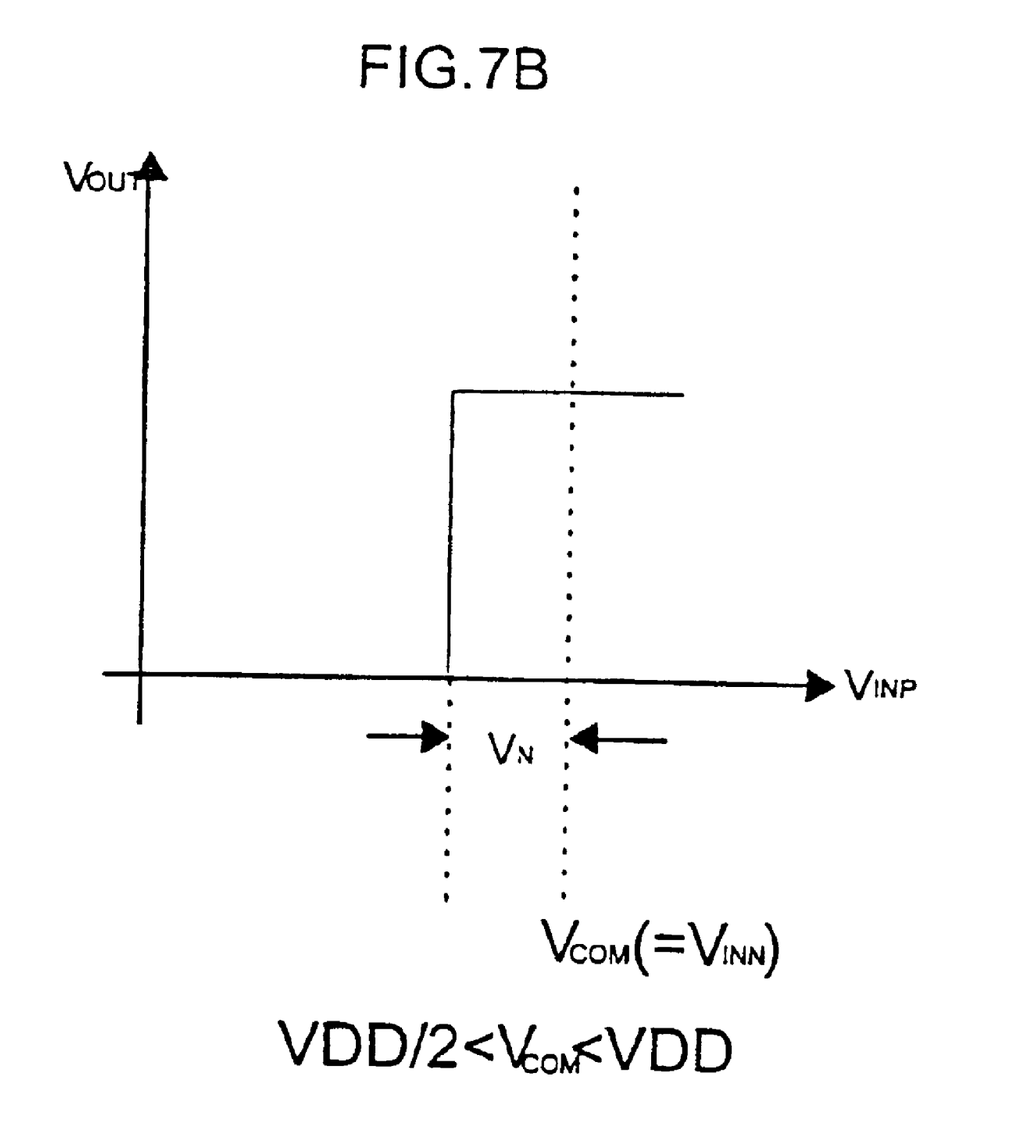
FIG. 7B is a diagram that shows a graph of voltage characteristics of the preferred embodiment of the comparator according to the present invention when a common voltage is higher than VDD/2.

FIG. 7A is a diagram that shows a circuit for operational characteristics of the preferred embodiment of the comparator according to the present invention when a common voltage is higher than VDD/2. FIG. 7B is a diagram that shows a graph of voltage characteristics of the preferred embodiment of the comparator according to the present invention when a common voltage is higher than VDD/2.

As shown in FIG. 7A and FIG. 7B, operations of the preferred embodiment of the input stage circuit when level of common voltage $V_{COM}$ ranges VDD/2 to VDD will now be described. The common voltage detection signal $S_{COM}$ outputted from the common voltage detector 500 becomes high level since $V_{COM} > V_{LT}$. Thus, the NMOS transistor 328 of the N channel driving circuit 308 becomes turned on, while the PMOS transistor 314 of the P channel driving circuit 306 becomes turned off.

The input stage circuit 302 of the comparator 304 according to the preferred embodiment is equalized with the circuit shown in FIG. 7A since the N channel driving circuit 308 has an influence on the current output part 310, but the P channel driving circuit 306 has no influence thereon. FIG. 7A is an equivalent circuit of an input stage circuit when VDD/2 < $V_{COM}$ < VDD, where the active loads 332 and 334 of the current output part 310 may be regarded as combined with the N channel driving circuit 308.

As shown in FIG. 7A, the voltage $V_{GS322}$ between the node 350 and the gate of the NMOS transistor 322 and the other voltage $V_{GS326}$ between the node 350 and the gate of the NMOS transistor 326 are represented by equation (5) as follows:

$$V_{GS322} = V_{INN} - V_N - V_{N350} \quad (5)$$
$$V_{GS326} = V_{INP} - V_{N350}$$

When $V_{GS322} > V_{GS326}$, that is, $V_{INN} > (V_{INP} + V_N)$, the current flowing through the drain of the NMOS transistor 322 is larger than that flowing through the drain of the NMOS transistor 326. Therefore, the output signal OUT of the comparator 304 becomes low level since the node voltage $V_{N346}$ is relatively higher than the other node voltage $V_{N348}$.

On the other hand, when $V_{GS316} > V_{GS320}$, that is, $V_{INN} < (V_{INP} + V_N)$, the current flowing through the drain of the NMOS transistor 326 is larger than that flowing through the drain of the PMOS transistor 320. Therefore, the output signal OUT of the comparator 304 becomes high level since the node voltage $V_{N348}$ is higher than the other node voltage $V_{N346}$. Such voltage characteristics are shown in FIG. 7B.

As shown in FIG. 7B, when $V_{INN} > (V_{INP} + V_N)$, the output signal OUT becomes high level.

As described above, preferred embodiments according to the present invention have various advantages. The preferred embodiments of a comparator with offset voltage according to the present invention enables sufficient amplification of an input signal difference of low common voltage by selectively applying an offset voltage to a common voltage in accordance with the common voltage level of the input signal.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A comparator that generates an output signal by comparing a first input voltage to a second input voltage, the comparator comprising:
    a bias voltage generator that produces a first bias voltage and a second bias voltage;
    a common voltage detector that generates a common voltage detection signal responsive to the first and second input voltages; and
    an input stage circuit that adjusts a voltage difference between the first input voltage and the second input voltage, wherein a first common voltage of the stage circuit is combined with a first offset voltage when the common voltage detection signal is a first level, wherein a second common voltage of the imput stage circuit is combined with a second offset voltage when the common voltage detection signal is a second level, and wherein the input stage circuit is coupled to the bias voltage generator to receive the first and second bias voltages and coupled to the common voltage detector to receive the common voltage detection signal.

2. The comparator according to claim 1, wherein the bias voltage generator comprises:
    first and second active loads coupled to a first prescribed reference voltage;
    a first constant voltage source coupled between the second active load and a second prescribed reference voltage that generates the first bias voltage from a reference voltage;
    a second constant voltage source coupled to the first active load that generates the second bias voltage from the first bias voltage; and
    a constant current source coupled between the first constant voltage source and the second prescribed reference voltage that provides the first constant voltage source with a constant current.

3. The comparator according to claim 1, wherein the bias voltage generator comprises:
    first and second transistors configured to operate as active loads;
    a logic amplifier having a non-inversion input terminal that receives a reference voltage and an inversion input terminal that is connected to a ground voltage through a resistor;
    a third transistor coupled between the first transistor and the resistor that generates a second electrode voltage equal to the reference voltage by being controlled by an output signal of the logic amplifier; and
    a fourth transistor coupled to the second transistor that generates the second bias voltage by operating as a constant voltage source having a diode connection.

4. The comparator according to claim 1, wherein the common voltage detector comprises:
    series coupled resistors that determines a DC common voltage of the first and second input voltages, wherein respective ends of the series coupled resistors receive the first and second input voltages; and
    a logic gate having an input that receives the detected DC common voltage, wherein the logic gate outputs the common voltage detection signal by transforming the DC common voltage.

5. The comparator according to claim 4, wherein the logic gate is an inverter, and wherein the common voltage detection signal becomes low level when the level of the DC common voltage is lower than that of the logic threshold voltage of the inverter and becomes high level otherwise.

6. The comparator according to claim 5, wherein the logic threshold voltage of the inverter is half of a power source voltage.

7. The comparator according to claim 1, wherein the input stage circuit comprises:
    a first driving circuit that receives the first and second input voltages, the first bias voltage and the common voltage detection signal, wherein the first driving circuit is activated when the common voltage detection signal is the first level, and wherein the first driving circuit combiness the first offset voltage with the first common voltage provided in the first driving circuit;
    a second driving circuit that receives the first and second input voltages, the second bias voltage and the common voltage detection signal, wherein the second driving circuit is activated when the common voltage detection signal is the second level, and wherein the second driving circuit combines the second offset voltage with the second common voltage provided in the second driving circuit; and
    a conditioning circuit coupled to the first and second driving circuits that amplifies the voltage difference between the first input voltage and the second input voltage, to output the output signal.

8. The comparator according to claim 7, wherein the common voltage detection signal is high level when a common voltage of the common voltage detector is equal to or higher than a prescribed voltage.

9. The comparator according to claim 7, wherein the first driving circuit comprises:
    a first serial circuit having first and second transistors connected in series, said first serial circuit connected to a power source voltage, wherein the first transistor is controlled by the first bias voltage and the second transistor is controlled by the by the common voltage detection signal; and a first parallel circuit having a third transistor controlled by the first input voltage connected in series with the first serial circuit at a first connection node through a first offset resistor and a fourth transistor controlled by the second input voltage and connected by a first electrode to the first connection node, and wherein the second driving circuit comprises, a second serial circuit having a fifth transistor controlled by the second bias voltage and a sixth transistor controlled by the common voltage detection signal that are connected in series, and a second parallel circuit having a seventh transistor controlled by the second input voltage connected in series with the second serial circuit through a second offset resistor and an eighth transistor controlled by the first input voltage and connected by a first electrode to the second connection node.

10. The comparator according to claim 9, wherein the conditioning circuit comprises:

a ninth transistor connected to the second parallel circuit, the ninth transistor configured to operate as an active load of the second driving circuit; and a tenth transistor connected to the first parallel circuit, the tenth transistor configured to operate as the current source of the firat driving circuit.

11. A method of operating a comparator, comprising:

receiving an inverting input signal and a non-inverting input signal from the outside of the comparator at first and second input terminals, respectively, differentially amplifying the inverting input signal and non-inverting input signal received at input transistors of a first differential amplifier, wherein at least one of the input of the first differential amplifier has a first offset resistor coupled to a first electrode;

differentially amplifying the inverting input signal and the non-inverting input signal received at input transistors of a second differential amplifier, wherein at least one of the input of the second differential amplifier has a second offset resistor coupled to a first electrode; and operating the first differential amplifier when a common mode voltage between the inverting input signal and the non-inverting input signal is less than a predetermined voltage, and operating the second differential amplifier when the common mode voltage is larger than the predetermined voltage.

12. The method of claim 11, wherein the input transistors of the first differential amplifier comprises:

a first PMOS transistor which has a control electrode coupled to the inverting input terminal and a first electrode connected to the first node; and a second PMOS transistor which has a control electrode coupled to the non-inverting input terminal, wherein the first offset resistor is coupled between a first electrode of the second PMOS transistor and the first node.

13. The method of claim 11, wherein the input transistors of the first differential amplifier comprises PMOS input transistors, and the second transistors of the second differential amplifier comprises NMOS input transistors.

14. The method of claim 11, wherein the predetermined voltage is half of power source voltage.

* * * * *